United States Patent [19] [11] 3,939,372
Wurst et al. [45] Feb. 17, 1976

[54] CONTACT-FREE PULSE GENERATORS
[75] Inventors: John W. Wurst, Dover; James E. O'Brien, Kenilworth, both of N.J.
[73] Assignee: The Singer Company, New York, N.Y.
[22] Filed: Nov. 7, 1974
[21] Appl. No.: 521,712

Related U.S. Application Data
[63] Continuation of Ser. No. 364,836, May 29, 1973, abandoned.

[52] U.S. Cl. ............ 310/168; 310/154; 310/DIG. 4
[51] Int. Cl.² ......................................... H02K 19/24
[58] Field of Search ........................... 310/168–171, 310/74, 154, 75, 113, DIG. 3, 114; 123/148; 307/106; 338/32 H, 32; 318/138, 254; 74/567, 568, 568 T

[56] References Cited
UNITED STATES PATENTS

| | | | |
|---|---|---|---|
| 2,924,633 | 2/1960 | Sichling | 123/148 |
| 3,112,464 | 11/1963 | Ratajski | 338/32 |
| 3,267,399 | 8/1966 | Spieker | 310/168 |
| 3,309,642 | 3/1967 | Grancoin | 338/32 H |
| 3,473,061 | 10/1969 | Soehner | 310/168 |
| 3,531,671 | 9/1970 | Hohne | 310/168 |
| 3,564,313 | 2/1971 | Goor | 310/168 |
| 3,754,175 | 8/1973 | Girault | 318/138 |

Primary Examiner—R. Skudy
Attorney, Agent, or Firm—Robert E. Smith; M. J. Breen; C. A. Williams, Jr.

[57] ABSTRACT

A contact-free electrical pulse generator, that utilizes a Hall effect device and a permanent magnet to generate lines of flux and provides two stable output states when cooperating with a flux conducting cam having a stepped peripheral circumference mounted on a rotating shaft is disclosed. The flux conducting cam enhances the flux density imposed upon the Hall effect device when the high portion of the cam becomes proximate the Hall device. The concentrated flux lines flowing through the Hall device changes the state of the device in accordance with the preselected angular positions of the rotary shaft.

1 Claim, 2 Drawing Figures

CONTACT-FREE PULSE GENERATORS

This is a continuation of application Ser. No. 364,836 filed May 29, 1973, now abandoned.

BACKGROUND OF THE INVENTION

The present invention relates to pulse generators, and in particular to an electrical contact-free pulse generator, which uses a Hall effect device to provide an output pulse relative to shaft position.

Electrical pulse generators are frequently used for electromechanical control systems to initiate or terminate a mechanical function. Frequently a rotating shaft must be synchronized with the control mechanism in order to perform the function at a prescribed time of a particular cycle. Mechanical position sensors, which sense the position of a rotating shaft are subject to fatigue since the moving parts wear out with constant use. Static sensing devices which utilize light beams and photoelectric sensors have not been entirely satisfactory in areas where the atmosphere is lint laden, since the lint and dust in the area cause the sensors to become obscured, thereby reducing the sensitivity and accuracy of the sensors and requiring frequent maintenance.

Other known position sensing devices, used on a rotating shaft for synchronization thereof, include a permanent magnet affixed or coupled to a rotating shaft cooperating with an electromagnet sensor, which provides an electrical pulse each time the permanent magnet passes over a gap provided in the electromagnet's core. Other pulse generators known in the art, utilize a rotating magnet and a stationary Hall effect device to sense and provide a pulse each time the permanent magnet becomes proximate the Hall device. Still other sensing devices which operate in conjunction with a rotating shaft utilize an electromagnet which has a core provided with an air gap. A non-flux conducting disc, provided with openings therein, is generally affixed or coupled to the shaft and placed in the air gap of the electromagnet. When the non-flux conducting portion of the disc is within the air gap of the electromagnet the flux lines are broken and the inductance of the electromagnet decreases. When the disc rotates so that the opening of the disc is within the air gap of the electromagnet the inductance of the electromagnet increases. This change of state of the electromagnet may be used directly or indirectly, e.g. to control the feedback of an oscillator, thereby, yielding an output which is related to the position of the shaft. In addition, known in the prior art is a spirally shaped permanent magnet, which is affixed to a shaft proximate a Hall device. Rotating the shaft changes the output or state of the Hall device in varying amounts relative to the position of the shaft upon which the magnet is affixed. Generally, the prior art devices require that the permanent magnet device be affixed to the rotating shaft, or the flux lines of the magnet be cut to effect a change in the state of the sensors. All of the pulse generators of which we are aware provide a signal responsive to the shaft positions of a rotating member, however, none of the prior art systems, to our knowledge, utilize a stationary permanent magnet and a stationary Hall effect device, proximate thereto, to provide signal pulses responsive to the discrete positions of a rotating member.

SUMMARY OF THE INVENTION

A contact-free pulse generator utilizing the principles of the present invention overcomes the shortcomings of the prior art by providing a synchronizing pulse responsive to discrete positions of a rotating shaft. The generator of the present invention is reliable, essentially maintenance free and may be utilized in atmospheres which have a high concentration of dust and lint.

A contact-free pulse generator, in accordance with the principles of the present invention, comprises a base member, magnetic flux generating means secured to the base member, a Hall effect device supported by the base member in a predetermined relation with the magnetic flux generating means, the Hall effect device has at least two stable states depending on the level of flux density imposed thereon, a rotary shaft adapted to be journaled relative to the base member, and a magnetic flux density influencing disc fixed to the rotary shaft and having a variably shaped peripheral contour cooperating with the Hall effect device for changing the magnetic flux density imposed by the magnetic flux generating means on the Hall effect device in accordance with preselected angular positions of the rotary shaft.

BRIEF DESCRIPTION OF THE DRAWINGS

The invention will now be described with reference to the accompanying drawing of the preferred embodiment in which.

DESCRIPTION OF THE PREFERRED EMBODIMENT

Figure 1:
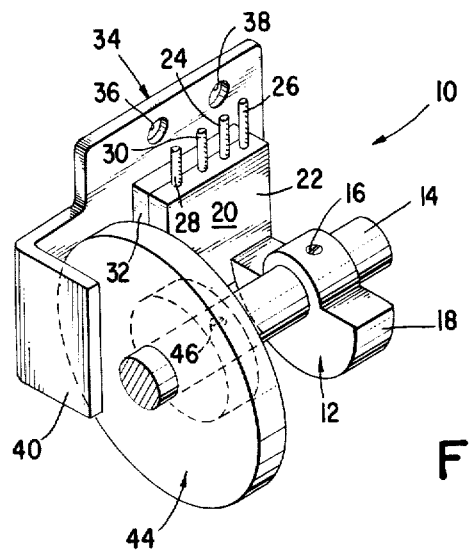
FIG. 1 is an elongated perspective view of a pulse generator built in accordance with the principles of the present invention.

Referring to the drawing, and in particular to FIG. 1, in which an enlarged perspective view of the preferred embodiment of the pulse generator 10 is shown. The pulse generator 10 includes a semi-circular shaped cam 12 affixed to a shaft 14 and retained thereon by a screw 16. The cam 12 has a variable (stepped) peripheral circumference 18. The circumference 18 is adapted to cooperate with a Hall effect device 20. The Hall effect device 20, utilized in the preferred embodiment of the invention, is a standard part number 1554 manufactured by the Microswitch Division of Honeywell. Included in the Hall device, in addition to a Hall sensing element, is a threshold detector that provides a fixed output voltage when the Hall sensing element provides a minimum voltage value across its terminals in the presence of lines of flux. Hereafter, when reference is made to a Hall device it will be understood to include both the Hall sensing element and a threshold detector. Thus, the Hall device 20 provides an output voltage of approximately 4 volts with the south pole of permanent magnet proximate a prescribed portion of the surface 22 of the device 20. Removal of the magnet or reducing the lines of flux proximate the surface area 22 provides a low level output voltage of approximately 0.3 volts. The Hall effect device described provides the aforementioned voltages across leads 24 and 26 when a D.C. voltage of plus 5 volts is provided across input leads 28 and 30 with lead 28 being retained at a reference ground potential.

It is to be noted that although the Hall effect device has been described in the preferred embodiment of the invention, any solid state phenomena such as magneto-resistance, would work equally as well as long as the device was able to distinguish between the two flux levels presented by the semi-circular shaped cam 12.

The Hall effect device 20 is retained preferably by an adhesive material proximate a permanent magnet 32 which extends the full length of the Hall device. The permanent magnet 32 is polarized with its north pole adjacent the Hall effect device 20 its south pole adjacent a flux conducting mounting base member 34. The mounting base member 34 is provided with two holes 36 and 38 which are used to mount the base member to any portion of a utilization device, not shown, which is proximate the rotating shaft 14. The mounting base member 34 is also provided with an outwardly extending portion 40 which is at a right angle to the base member 34 and is adapted to cooperate with the circular shaped disc member 44 affixed to the shaft 14 by a set screw 46. The disc member 44 is made of a flux conducting material which is similar to the material of the mounting base member 34, the shaft 14 and the cam 12. The disc member 44 is positioned in close proximity to the outwardly extending portion 40 of the mounting base member 34 as is practical to reduce the air gap therebetween, thereby enhancing the flow of flux lines 48 provided by the permanent magnet 32.

Figure 2:
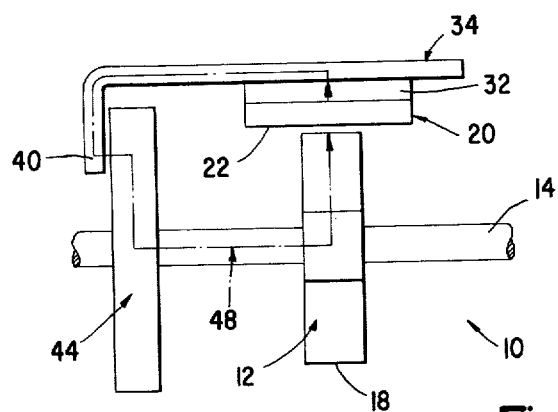
FIG. 2 is a diagrammatic elevational view of the pulse generator showing the path of the flux lines.

The path of the flux lines 48 emanating from the permanent magnet 32 is shown in FIG. 2. The path of the flux lines is from the magnet 32, through the base member 34, end portion 40, disc 44, shaft 14, cam 12, and sensor 20, when the air gap between the cam 12 and the sensor 20 is minimized.

In operation, an electrical signal pulse is provided each time the cam surface 18 enhances or concentrates the lines of flux on the surface 22 of the Hall sensor device 20. The output signal pulse obtained across leads 24 and 26 is maintained as long as the cam surface 18 is in proximity with the surface 22 of the Hall sensor device 20. The duration of the pulses that may be obtained and the number of pulses per revolution may be varied by changing the configuration of the cam 12, by varying the shape of the surface such that additional grooves or steps may be incorporated therein. The electrical pulse signal obtained from leads 24 and 26 may be coupled to any conventional utilization device which requires pulses in synchronism with the rotation of the shaft 14. In the position indicated in FIG. 1, the air gap between the surface 18 of cam 12 and the Hall device 20 is minimized, therefore, the electrical output signal is four volts as described earlier and remains at that level until the shaft 14 completes one-half revolution. When the lower portion of cam 12 becomes proximate the surface 22 of Hall device 20 the flux lines are dispersed and do not travel through the Hall sensor thereby reducing its output voltage, appearing on lines 24 and 26, to approximately 0.3 volts.

Hereinbefore has been disclosed a contact-free pulse generator that provides an electrical signal pulse relative to a shaft position and is idealy suited for use in a lint or dust laden atmosphere and may be used to synchronize a electromechanical control system with a rotating shaft. The disclosed contact-free pulse generator is reliable, requires a minimum of maintenance, and may be used in any requirement which requires an electrical signal pulse relative to the shaft position.

Having thus set forth the nature of the invention, what is claimed herein is:

1. A contact-free electrical pulse generator, comprising;
   a. a flux conducting base member
   b. permanent magnet means adapted to be affixed to said base member for providing a source of flux lines;
   c. a Hall effect sensor device adapted to be mounted juxtaposition said magnet means and within the path of said flux lines, said sensor device having at least two stable states depending on the level of flux density imposed thereon;
   d. a flux conducting rotary shaft means adapted to be journaled in spaced relation to said base member and adapted to cooperate with said base member to enhance the flow of said flux lines;
   e. flux conducting cam means adapted to be carried by said rotatable shaft in a position to cooperate with said Hall sensor device in said flux path, said cam means having a stepped peripheral circumference for changing the magnetic flux density imposed by said magnet means on said Hall sensor device in accordance with preselected angular positions of said rotary shaft means;
   f. said base member including a portion at one end extending outwardly therefrom toward said rotary shaft means and said rotary shaft means in addition to said flux conducting cam means including a circular shaped flux conducting disc carried thereon and adapted to rotate in overlapped relation proximate said outwardly extending base member portion to provide a magnetic flux conducting circuit with the base member through the circular disc, the shaft, and the cam means.

* * * * *